US006961114B2

(12) United States Patent
Murayama et al.

(10) Patent No.: US 6,961,114 B2
(45) Date of Patent: Nov. 1, 2005

(54) OPTICAL APPARATUS AND EXPOSURE APPARATUS INCORPORATING THE APPARATUS

(75) Inventors: Masayuki Murayama, Chiyoda-ku (JP); Kyoji Nakamura, Chiyoda-ku (JP); Taro Ogata, Chiyoda-ku (JP); Susumu Mori, Chiyoda-ku (JP)

(73) Assignee: Nikon Corporation, Chiyoda-ku (JP)

( * ) Notice: Subject to any disclaimer, the term of this patent is extended or adjusted under 35 U.S.C. 154(b) by 10 days.

(21) Appl. No.: 10/446,000

(22) Filed: May 27, 2003

(65) Prior Publication Data

US 2003/0206280 A1 Nov. 6, 2003

Related U.S. Application Data

(63) Continuation of application No. 09/675,728, filed on Sep. 29, 2000, now abandoned, which is a continuation of application No. PCT/JP99/01562, filed on Mar. 26, 1999.

(30) Foreign Application Priority Data

Mar. 31, 1998 (JP) ............................................ 10-086054

(51) Int. Cl.[7] .......................... G03B 27/52; G03B 27/42
(52) U.S. Cl. ........................................................ 355/30
(58) Field of Search .............................. 355/30, 53, 55, 355/67–71; 356/399–401; 430/311

(56) References Cited

U.S. PATENT DOCUMENTS

| 4,666,273 A | * | 5/1987 | Shimizu et al. .............. 353/101 |
| 4,699,505 A | | 10/1987 | Komoriya et al. ............. 355/30 |
| 4,704,348 A | * | 11/1987 | Koizumi et al. ............. 430/327 |
| 4,989,031 A | * | 1/1991 | Kamiya ........................ 355/30 |
| 5,430,303 A | * | 7/1995 | Matsumoto et al. ...... 250/492.2 |
| 5,559,584 A | * | 9/1996 | Miyaji et al. ................... 355/73 |
| 5,852,518 A | * | 12/1998 | Hatasawa et al. ............ 359/822 |
| 6,333,775 B1 | * | 12/2001 | Haney et al. .................. 355/30 |

FOREIGN PATENT DOCUMENTS

JP 62-286226 12/1987

OTHER PUBLICATIONS

Search Report from related EP application EP 99 91 0730 dated Mar. 8, 2005.

* cited by examiner

Primary Examiner—Henry Hung Nguyen
(74) Attorney, Agent, or Firm—Synnestvedt & Lechner LLP

(57) ABSTRACT

An optical apparatus having at least one optical element arranged along an optical path of an irradiation light. A first hermetic chamber is defined along the optical path separating the optical path from ambient air and charged with a predetermined gas. A second hermetic chamber is located in the first hermetic chamber separating the optical path from the gas in the first hermetic chamber and retaining the optical elements.

23 Claims, 6 Drawing Sheets

OPTICAL APPARATUS AND EXPOSURE APPARATUS INCORPORATING THE APPARATUS

RELATED APPLICATION

This application is a continuation of U.S. application Ser. No. 09/675,728 filed on Sep. 29, 2000, now abandoned, which is a continuation of PCT application number PCT/JP99/01562 filed on Mar. 26, 1999. U.S. application Ser. No. 09/675,728 is hereby incorporated by reference herein.

BACKGROUND OF THE INVENTION

The present invention relates to an optical apparatus that retains an optical element. Further, the present invention relates to an exposure apparatus that employs an optical apparatus in an optical system, which illuminates a mask with an exposure light and uses the exposure light to transfer a pattern of the mask on a substrate.

In a conventional exposure apparatus, in which an exposure light from a light source, such as an ArF excimer laser, is employed, the exposure of the exposure light to the oxygen in the air causes absorption of the exposure light by the oxygen and forms ozone. This is because the illumination spectral line of the exposure light is included in the absorption spectral line range of the oxygen. The formation of ozone may deposit a clouding substance on the surface of an optical lens and affect the characteristic of the lens in an undesirable manner. Accordingly, the space encompassing the optical path between the light source and the substrate is partially or completely covered by a cover. The interior of the cover is charged with a gas that is inert to the exposure light, such as nitrogen gas.

However, deterioration in the hermetic seal of the cover may cause ambient air, which includes impurities, to enter the cover through the deteriorated portion and deposit the above clouding substance on the optical lens surface.

SUMMARY OF THE INVENTION

It is an object of the present invention to improve the optical apparatus having a cover covering the space encompassing the optical path and enhance the functions for protecting the optical lens. It is also an object of the present invention to provide an exposure apparatus that enhances the functions for protecting the optical lens.

An optical apparatus according to the present invention includes at least one optical element arranged along an optical path of an irradiation light, the optical apparatus comprising a first hermetic chamber defined along the optical path separating the optical path from ambient air and charged with a predetermined gas, and a second hermetic chamber located in the first hermetic chamber separating the optical path from the gas in the first hermetic chamber and retaining the optical elements. Accordingly, the hermetic seal about the optical path is improved and the function for protecting optical elements is enhanced.

In an apparatus of the preferred embodiment, the second hermetic chamber includes a section located between two of the optical elements. Accordingly, optical elements forming optical systems are used effectively to form the second hermetic chamber in a facilitated and ensured manner.

The gas in the first hermetic chamber is a gas that is more pure than the ambient air, and the second hermetic chamber is charged with a gas that is inert gas to the irradiation light. In this case, even if the hermetic seal between the first hermetic chamber and the second hermetic chamber deteriorates and results in the pure gas of the first hermetic chamber flowing into the second hermetic chamber, the optical elements are only exposed to the pure gas. Thus, optical elements are not contaminated. Further, there is no possibility of the formation of ozone caused by the reaction between the gas in the second hermetic chamber and the irradiation light.

Additionally, the gas in the first hermetic chamber is a gas that is inert to the irradiation light, and the second hermetic chamber is charged with a gas that is inert gas to the irradiation light. In this case, even if the hermetic seal between the first hermetic chamber and the second hermetic chamber deteriorates and results in the gas of the first hermetic chamber flowing into the second hermetic chamber, the second hermetic chamber is always charged with the inert gas. Accordingly, the formation of ozone is suppressed and the function for protecting optical elements is further enhanced.

In an apparatus of the preferred embodiment, a sensor for measuring the concentration of a gas in the second hermetic chamber is provided. Accordingly, even if the hermetic seal between the first hermetic chamber and the second hermetic chamber deteriorates and results in the gas of the first hermetic chamber flowing into the second hermetic chamber, an abnormality of the second hermetic chamber is detected based on a signal from the sensor. Thus, maintenance is facilitated.

An apparatus of the preferred embodiment includes a partition for defining the first hermetic chamber and the second hermetic chamber, and the partition includes a switch opening. An actuating mechanism increases and decreases an opened amount of the switch opening, and at least one optical member is arranged in the first hermetic chamber or the second hermetic chamber through the switch opening. A controller sets a first switch mode in which movement of the optical member between the first hermetic chamber and the second hermetic chamber is permitted by increasing the opening amount of the switch opening with the actuating mechanism, and a second switch mode in which movement of the optical member between the first hermetic chamber and the second hermetic chamber is prevented by decreasing the opened amount of the switch opening with the actuating mechanism. In this case, the movement of the optical member is facilitated and the hermetic seal of the space about the optical path is maintained.

Furthermore, it is preferred that a revolver, which supports the optical member and is rotatable about an axis, and a drive apparatus, which drives the revolver, be provided. In this case, the controller controls the drive apparatus to rotate the revolver, and the rotation of the revolver moves the optical member between the first hermetic chamber and the second hermetic chamber.

In a preferred embodiment, the above optical apparatus may be incorporated in an exposure apparatus. The exposure apparatus includes an optical system for irradiating a mask with exposure light and transferring a pattern of the mask on a substrate with the exposure light that has passed through the mask.

Further, the optical apparatus preferably includes at least one of a plurality of first optical element groups for irradiating the mask with the exposure light and a plurality of second optical element groups for guiding the exposure light that has passed through the pattern of the mask to the substrate. The second hermetic chamber includes at least one of an illumination lens barrel for encompassing and retaining the first optical element groups and a projection lens barrel for encompassing and retaining the first optical element groups.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
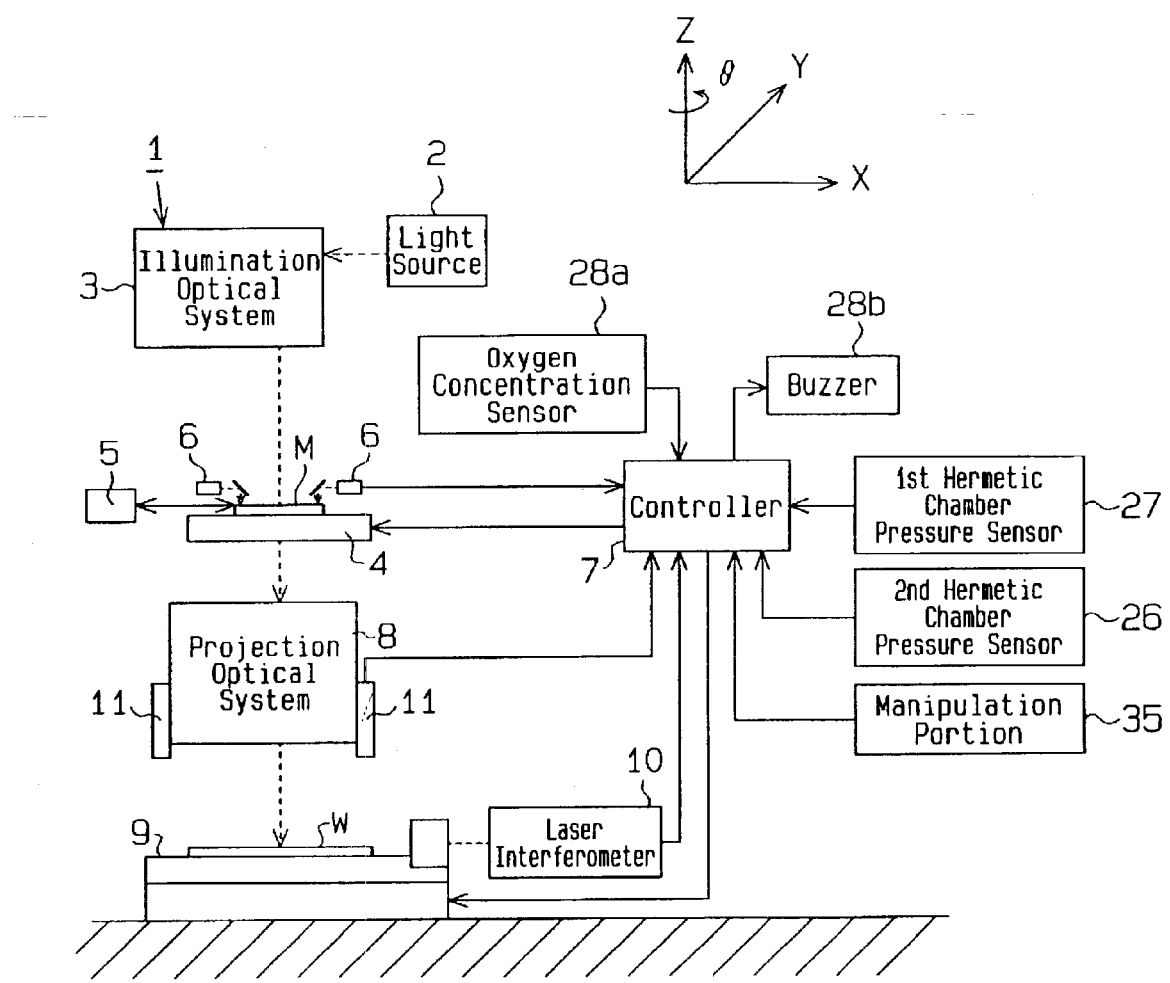
FIG. 1 is a schematic plan view showing an exposure apparatus according to the present invention.

An exposure apparatus according to a first embodiment of the present invention will now be discussed with reference to FIGS. 1 and 2. An exposure apparatus 1 shown in FIG. 1 is provided with a light source 2. The light source 2 is formed by an excimer laser, an Hg lamp, or the like, and emits ultraviolet rays or far ultraviolet rays into an illumination optical system 3.

Although not shown in the drawings, the illumination optical system 3 includes a collimator lens, a fly eye lens, and a reticle blind or dichroic mirror, and uses the ultraviolet rays or far ultraviolet rays emitted from the light source 2 as a uniform exposure light (irradiation light). The exposure light illuminates a mask M on a mask stage 4.

The mask M is held on the mask stage 4, which is movable along a two dimensional XY plane, by means of vacuum suction. A mask exchanging mechanism 5 holds a plurality of the masks M having different patterns and exchanges the masks with the mask M on the mask stage 4. A mask alignment optical system 6 detects alignment marks formed on the masks M and outputs the detection results to a controller 7.

A photosensitive substrate W is held on a photosensitive stage 9 by means of vacuum suction. When illuminated by the exposure light, the pattern formed on the mask M is transferred to the photosensitive substrate W by a projection optical system 8. The photosensitive substrate stage 9 is movable in the XYZθ directions. The position of the photosensitive substrate stage 9 is measured by a laser interferometer 10, and the measurement result is output to the controller 7.

An off-axis substrate alignment optical system 11 is arranged at the periphery of the projection optical system 8. The substrate alignment optical system 11 detects an alignment mark formed on the photosensitive substrate W and outputs the detection result to the controller 7.

The controller 7 controls the entire exposure apparatus 1 including the drive system of the mask stage 4 and the drive system of the photosensitive substrate stage 9 based on the input signals from the mask alignment optical system 6, the laser interferometer 10, and the substrate alignment optical system 11.

As described above, the exposure apparatus 1 includes an optical path that extends from the light source 2 to the photosensitive substrate W via the illumination optical system 3 and the projection optical system 8. The optical apparatus of the present invention is located partially or entirely about the optical path extending through at least one of the illumination optical system 3 and the projection optical system 8.

Figure 2:
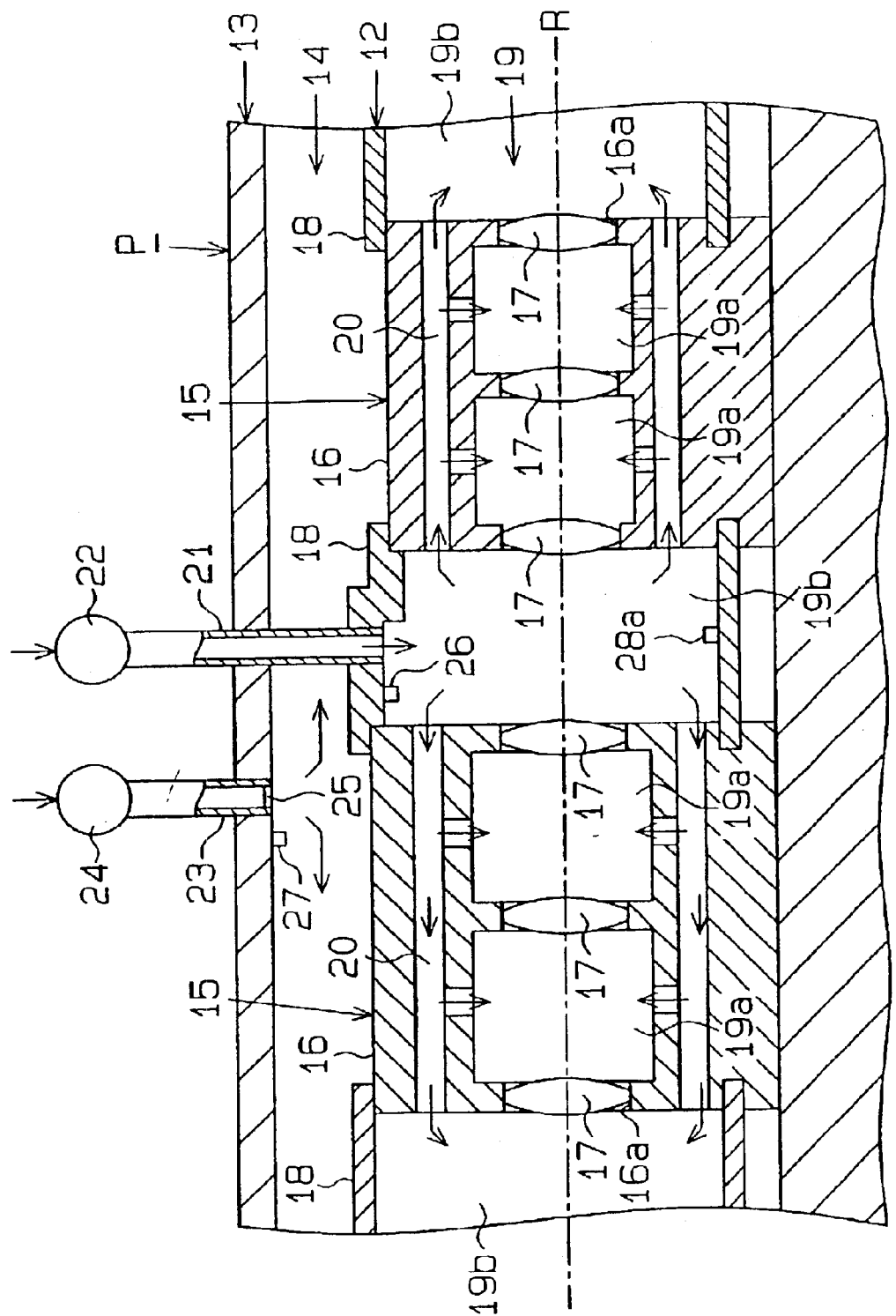
FIG. 2 is a schematic cross-sectional view showing an optical apparatus according to a first embodiment of the present invention.

An optical apparatus P shown in FIG. 2 is arranged in the projection optical system 8. The optical apparatus P includes an inner cover 12, or partition, which covers the space about an optical path R, and an outer cover 13, which encloses the inner cover 12. Accordingly, the optical apparatus P has a two-part cover structure.

The outer cover 13 defines a first hermetic chamber 14, which is separated from the surrounding gases, or ambient air. A plurality of lens systems 15 are arranged in series along the optical path R in the inner cover 12. Each of the lens systems 15 includes projection lens barrels 16 and a plurality of lenses 17 (optical elements) arranged in series along the optical path R in the projection lens barrels 16. The peripheral portion of each of the lenses 17 is held by the projection lens barrel 16, that is, by a holding portion 16a located in the inner portion of a holding member.

The inner cover 12 is formed by the projection lens barrels 16 and coupling tubes 18, which connect the projection lens barrels 16. The interior space of the inner cover 12 includes inner sections 19a, which are located between adjacent lens 17 in the projection lens barrels 16, and intermediate sections 19b, which are located between the lens 17 of one projection lens barrel 16 and the lens 17 held by another, adjacent projection lens barrel. The sections 19a, 19b are connected to one another by a passage 20 extending through the projection lens barrel 16 and form a second hermetic chamber 19 within the inner cover 12.

The second hermetic chamber 19 is located inside the first hermetic chamber 14, which is at the inner side of the outer cover 13, and is separated from the first hermetic chamber 14. The exposure light passes through each of the sections 19a, 19b and each of the lenses 17.

A first gas supply passage 21 is connected to the inner cover 12 to supply optical path gas to the path of the exposure light. In this embodiment, the first gas supply passage 21 is connected to a predetermined one of the coupling tubes 18. The first gas supply passage 21 is provided with optical path gas from a gas supply portion 22. Gas that is inert to the exposure light, such as nitrogen gas, is used as the optical path gas. The optical path gas is supplied from the first gas supply passage 21 to the intermediate section 19b in the coupling tube 18 and then passes through the passage 20 in each of the projection lens barrels 16 reaching the inner section 19a of each of the projection lens barrels 16 and the inner sections 19b of the other coupling tubes 18.

The space between the inner cover 12 and the outer cover 13, that is, the first hermetic chamber 14, is charged with a shielding gas to separate the optical path from the ambient air. Although the shielding gas may differ from or be the same as the optical path gas in the second hermetic chamber 19, it is preferred that the gas be purified and be purged of substances that cause contamination of the optical member. For example, it is preferred that nitrogen gas or dry air be used as the shielding gas. It is preferred that if nitrogen gas is used as the optical path gas, nitrogen gas be used as the shielding path gas.

A second gas supply passage 23 for supplying the shielding gas to the first hermetic chamber 14 is connected to the outer cover 13. The second gas supply passage 23 is supplied with shielding gas from a second gas supply portion 24. The shielding gas is supplied from the second gas supply passage 23 to the first hermetic chamber 14 between the inner cover 12 and the outer cover 13. A filter 25 is arranged in the second gas supply passage 23 at the outlet leading into the first hermetic chamber 14 to eliminate impurities from the shielding gas. The impurities include, for example, ammonia, sulphate ions, nitrate ions, amines, siloxanes, and silicon compounds. The employment of the filter 25 further purifies the gas (e.g., dry air) supplied to the first hermetic chamber 14. In the same manner, a filter (not shown) is arranged in the first gas supply passage 21 at the outlet leading into the second hermetic chamber 19 to eliminate impurities from the optical path gas. This further enhances the function of protecting the optical elements, such as the lenses 17.

The pressure of the second hermetic chamber 19 is set higher than the pressure of the first hermetic chamber 14, which is located at the outer side the second hermetic chamber 19. When dry air is used as the shielding gas, it is preferred that the dew point of the dry air be −50° C. or lower and normally be about −10° C. and that the pressure be 7 kg/cm$^2$G or lower.

In the second hermetic chamber 19, a pressure sensor 26 is attached to the coupling tube 18 having the first gas supply passage 21. The pressure sensor 26 detects the gas pressure of the second hermetic chamber 19 and outputs the detection result to the controller 7 shown in FIG. 1. A second pressure sensor 27 is attached to the outer cover 13 in the first hermetic chamber 14 near the outlet of the second gas supply passage 23. The second pressure sensor 27 detects the gas pressure of the first hermetic chamber 14 and outputs the detection result to the controller 7 shown in FIG. 1.

The controller 7 compares the gas pressures computed from the detection signals of the pressure sensors 26, 27 and controls the gas supply portion 22 of the first gas supply passage 21 and the gas supply portion 24 of the second gas supply passage 23 so that the pressure of the second hermetic chamber 19 is higher than that of the first hermetic chamber 14.

A sensor 28a is attached to the coupling tube 18 in the second hermetic chamber 19 to measure the oxygen concentration in the second hermetic chamber 19. The sensor 28a outputs the detection result to the controller 7 shown in FIG. 1. The controller 7 activates a buzzer 28b (notifying means) when the oxygen concentration computed from the detection signal of the sensor 28a becomes greater than or equal to a certain value. Although the oxygen concentration of the hermetic chamber 19 is measured by the oxygen concentration sensor 28a, other sensors may be used as long as the concentration of the gas in the second hermetic chamber 19 can be detected.

The first embodiment has the advantages described below.

(1) The first hermetic chamber 14 and the second hermetic chamber 19 form a two-part structure in the space about the optical path R. Thus, even when the optical path gas in the second hermetic chamber 19 enters the first hermetic chamber 14 due to deterioration of the second hermetic chamber 19, the first hermetic chamber 14 eliminates the possibility of ambient air entering the second hermetic chamber 19 and prevents the formation of ozone. Further, the hermetic seal of the closed space about the optical path R is improved. Accordingly, protection of the projection optical system 8 is guaranteed.

Additionally, the pressure of the second hermetic chamber 19 is greater than that of the first hermetic chamber 14. This makes it difficult for the gas in the first hermetic chamber 19 to enter the second hermetic chamber 19. Accordingly, the hermetic seal of the closed space about the optical path R is improved, and protection of the optical systems 3, 8 is further guaranteed.

(2) The second hermetic chamber 19 includes the section between the optical elements (e.g., the lenses 17), which form the projection optical system 8. Accordingly, the required optical elements of the projection optical system 8 are used effectively thereby simplifying the structure of the second hermetic chamber 19 and further improving the hermetic seal of the closed space about the optical path R of the exposure light, which passes through the optical elements. Accordingly, the function for protecting the projection optical system 8 is further improved.

(3) The first hermetic chamber 14 is charged with purified gas (dry gas) from which substances that cause contamination are eliminated. Thus, even when the hermetic seal between the first hermetic chamber 14 and the second hermetic chamber 19 deteriorates and causes the purified gas of the first hermetic chamber 14 to enter the second hermetic chamber 19, the optical elements are only exposed to the purified gas and contamination of the optical elements is prevented. Accordingly, the function for protecting the projection optical system 8 is further improved.

(4) The second hermetic chamber 19 is charged with optical path gas that is inert to the exposure light, such as nitrogen gas. Thus, the exposure light is not exposed to the oxygen in the air and the formation of ozone is prevented. Accordingly, the function for protecting the projection optical system 8 is further improved.

(5) In addition to the second hermetic chamber 19, the first hermetic chamber 14 may also be charged with optical path gas that is inert to the exposure light, such as nitrogen gas. In this case, even when the hermetic seal between the first hermetic chamber 14 and the second hermetic chamber 19 deteriorates and causes the gas of the first hermetic chamber 14 to enter the second hermetic chamber 19, the second hermetic chamber 19 is always charged with inert gas and the formation of ozone is prevented. Accordingly, the function for protecting the projection optical system 8 is further improved.

(6) The sensor 28a for measuring the oxygen concentration is provided in the second hermetic chamber 19. Thus, when the hermetic seal between the first hermetic chamber 14 and the second hermetic chamber 19 deteriorates and causes the dry air of the first hermetic chamber 14 to enter the second hermetic chamber 19, such state is indicated when the signal from the oxygen concentration sensor 28a activates the buzzer 28b. Accordingly, an abnormality in the second hermetic chamber 19 is detected thus facilitating maintenance and improving the function for protecting the projection optical system 8.

(7) The advantages (1) to (6) are obtained by the projection optical system 8 of the exposure apparatus 1.

In the first embodiment, the projection optical system 8 of the exposure apparatus 1 has a two-part structure. In addition to the projection optical system 8, this structure may also be applied when optical elements such as lenses are arranged between the light source 2 and the photosensitive substrate W. For example, the two-part structure may also be applied to a lens barrel of the illumination optical system 3, or the like, which guides the light emitted from the light source 2 to the mask. The structure of the illumination optical system 3 will be described in detail when discussing a third embodiment.

Figure 3:
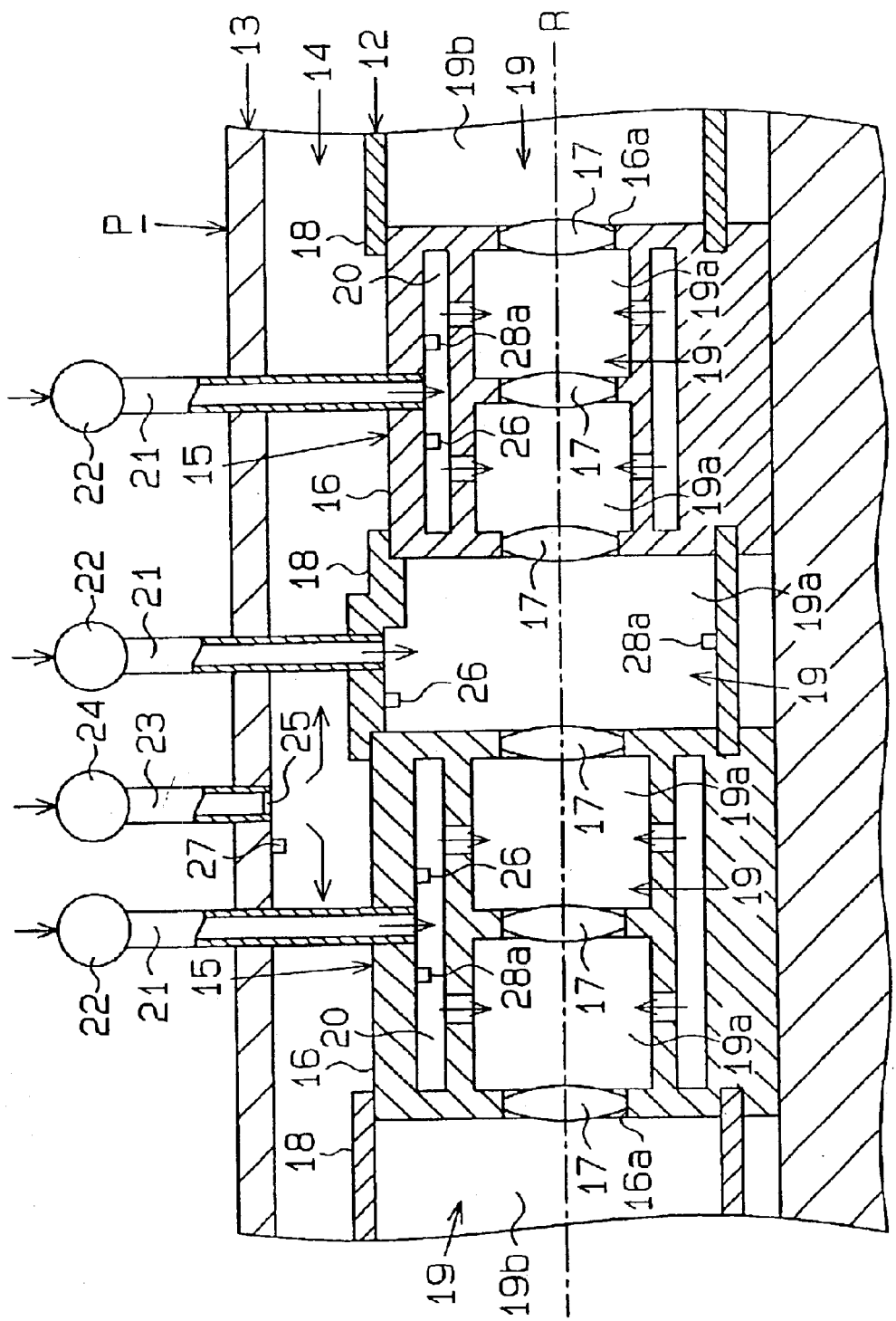
FIG. 3 is a schematic cross-sectional view showing an optical apparatus according to a second embodiment of the present invention.

A second embodiment according to the present invention will now be described with reference to FIGS. 1 and 3. The apparatus of the second embodiment differs from the apparatus of the first embodiment in the points discussed below. Members of the first embodiment that are identical to those in the second embodiment are denoted with a reference numeral that is the same as the first embodiment and will not be described.

In the projection lens barrel 16 of each lens system 15, the passage 20 is separated from the sections 19b of the coupling tubes 18 adjacent to the projection lens barrel 16. Accordingly, the sections 19a between the lenses 17 in each of the projection lens barrels 16 are separated from the section 19b in each of the coupling tubes 18. The sections 19a, 19b each form hermetic chamber 19. The hermetic chamber 19 of each projection lens barrel 16 and the second hermetic chamber 19 of each coupling tube 18 are each provided with the first gas supply passage 21, the gas supply portion 22, the pressure sensor 26, and the oxygen concentration sensor 28a.

In addition to advantages (1) to (7) of the first embodiment, the apparatus of the second embodiment has the advantage described below.

An independent hermetic chamber 19 is formed in each of the projection lens barrels 16 and each of the coupling tubes 18, and each of the hermetic chambers is provided with optical path gas. Thus, when performing maintenance in a certain hermetic chamber of the projection lens barrels 16 and the coupling tubes 18, the maintenance of the certain hermetic chamber may be performed while maintaining the hermetic state of the other hermetic chambers. Accordingly, the function for protecting the projection optical system 8 is further improved.

A third embodiment according to the present invention will now be described with reference to FIGS. 1, 4, and 5. In each of the above embodiments, among the illumination optical system 3 and the projection optical system 8 of the exposure apparatus 1, the projection optical system 8 is provided with the optical apparatus P. In the optical apparatus P, as described above, the projection lens barrel 16 encompassing and holding the plurality of groups of the lenses 17, which transcribes the pattern of the mask M onto the photosensitive substrate W, forms part of the second hermetic chambers 19. In comparison, in the third embodiment, the optical apparatus P is provided in the illumination optical system 3. Members of the first embodiment that are identical to those in the third embodiment are denoted with a reference numeral that is the same as the first embodiment and will not be described.

Among the plurality of the lens systems 15, the coupling tube 18 between a predetermined pair of the lens systems 15 is formed by a pair of spaced movable shielding cylinders 18a, 18b. The movable shielding cylinders 18a, 18b are fitted to the periphery of an illumination lens barrel 16 of the lens systems 15 movably along the optical path R and are faced toward each other between the lens systems 15. A guide (not shown) for moving the movable shielding cylinders 18a, 18b along the optical path T is arranged between the movable shielding cylinders 18a, 18b and the illumination lens barrel 16. The guide is formed by, for example, a static pressure bearing guide and a linear motor, or the like, that provides fluid or gas between the shielding cylinders 18a, 18b and the illumination lens barrel 16.

The movable shielding cylinders 18a, 18b are each connected to a drive apparatus 30 in the first hermetic chamber 14 between the inner cover 12 and the outer cover 13. The drive apparatuses 30 move the movable shielding cylinders 18a, 18b toward and away from each other along the optical path R. The movement of the movable shielding cylinders 18a, 18b toward and away from each other forms a switch opening 29, which can be opened and closed, in the inner cover 12. The shielding cylinders 18a, 18b form an activating mechanism for opening and closing the switch opening 29.

An optical device 31 includes a circular revolver 33, which is rotatably supported by a drive apparatus 32 in the first hermetic chamber 14 of the outer cover 13, and plural types of optical members 34a, which are arranged on the peripheral portion of the revolver 33 along its rotational path. Cylindrical members 34b, which are fitted into the movable shielding cylinders 18a, 18b, are arranged along the peripheral portion of the optical member 34a.

The optical device 31 retains a plurality of fly eye lens groups, or the optical members 34a. The lens groups have, for example, different eccentric states relative to the optical axis of the optical path in accordance with the difference in the cyclic characteristic of the patterns of the mask M. Further, to change the illumination condition, the optical device 31 may be provided with a plurality of diaphragms having openings of different shapes. In this case, the optical member 34a has diaphragms.

The optical device 31 extends from the first hermetic chamber 14 in the outer cover 13 through the switch opening 29 and into the second hermetic chamber 19. When the movable shielding cylinders 18a, 18b are separated from each other and the opened amount of the switch opening is maximum, the drive apparatus 32 rotates the revolver 33. This sequentially positions the optical members 34a in the second hermetic chamber 19 at the inner side of the inner cover 12 between the lens systems 15.

A first gas supply passage 21 is connected to each of the illumination lens barrels 16 in the inner cover 12. Optical path gas is provided to each of the first gas supply passages 21 from a gas supply portion 22. The optical path gas flows from the first gas supply passages 21 through the passages 20 in the illumination lens barrels 16 and is provided to each of the sections 19a. The optical path gas further flows through the passages 20 in the illumination lens barrels 16 and is provided to the sections 19b in the movable shielding cylinders 18a, 18b (coupling tube 18). The sections 19b in the movable shielding cylinders 18a, 18b are separated from the space in the other coupling tubes 18 by the lens systems 15.

Figure 4:
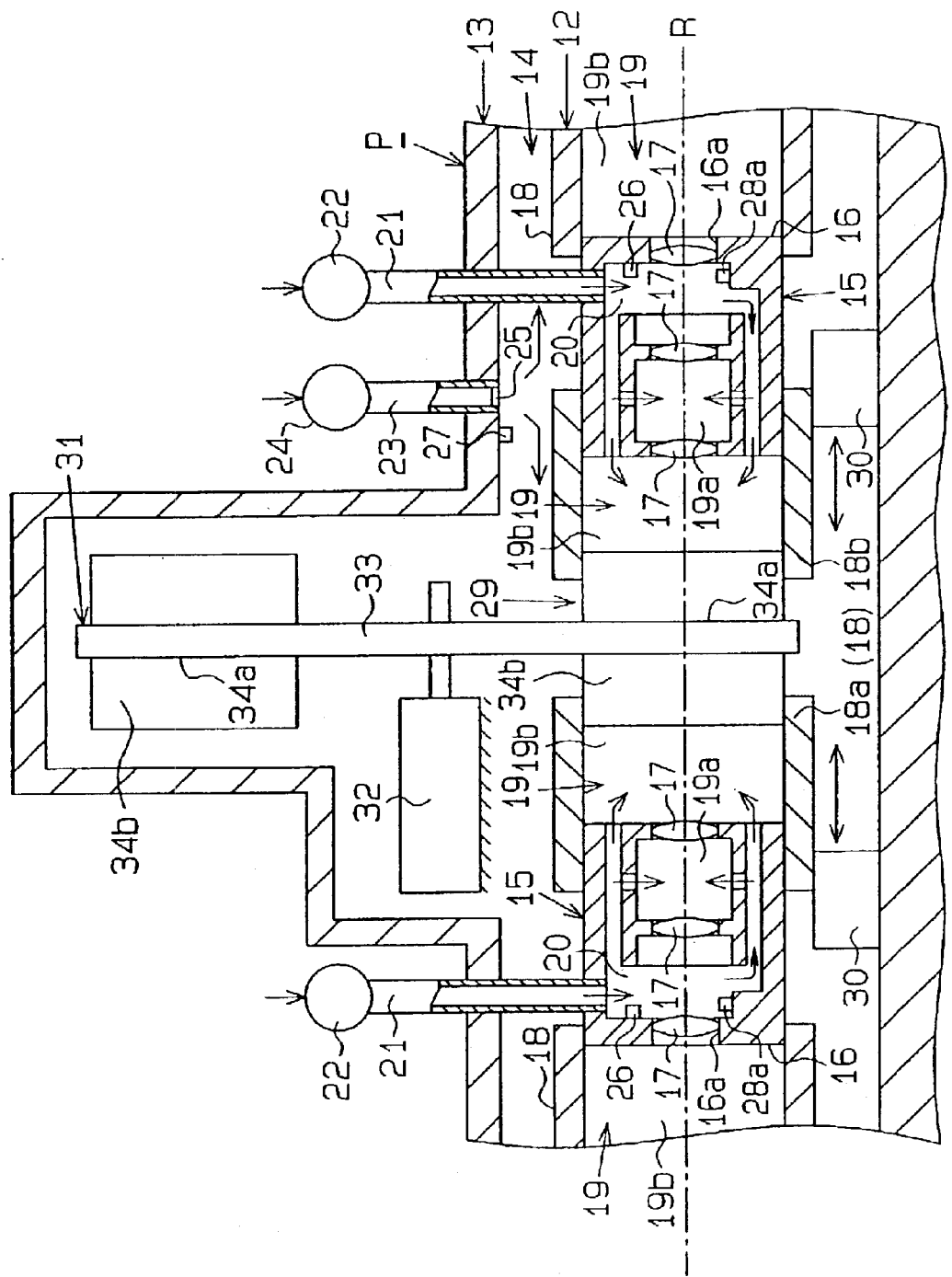
FIG. 4 is a schematic cross-sectional view showing an optical apparatus according to a third embodiment of the present invention in a state in which switching of an optical member is completed.
Figure 5:
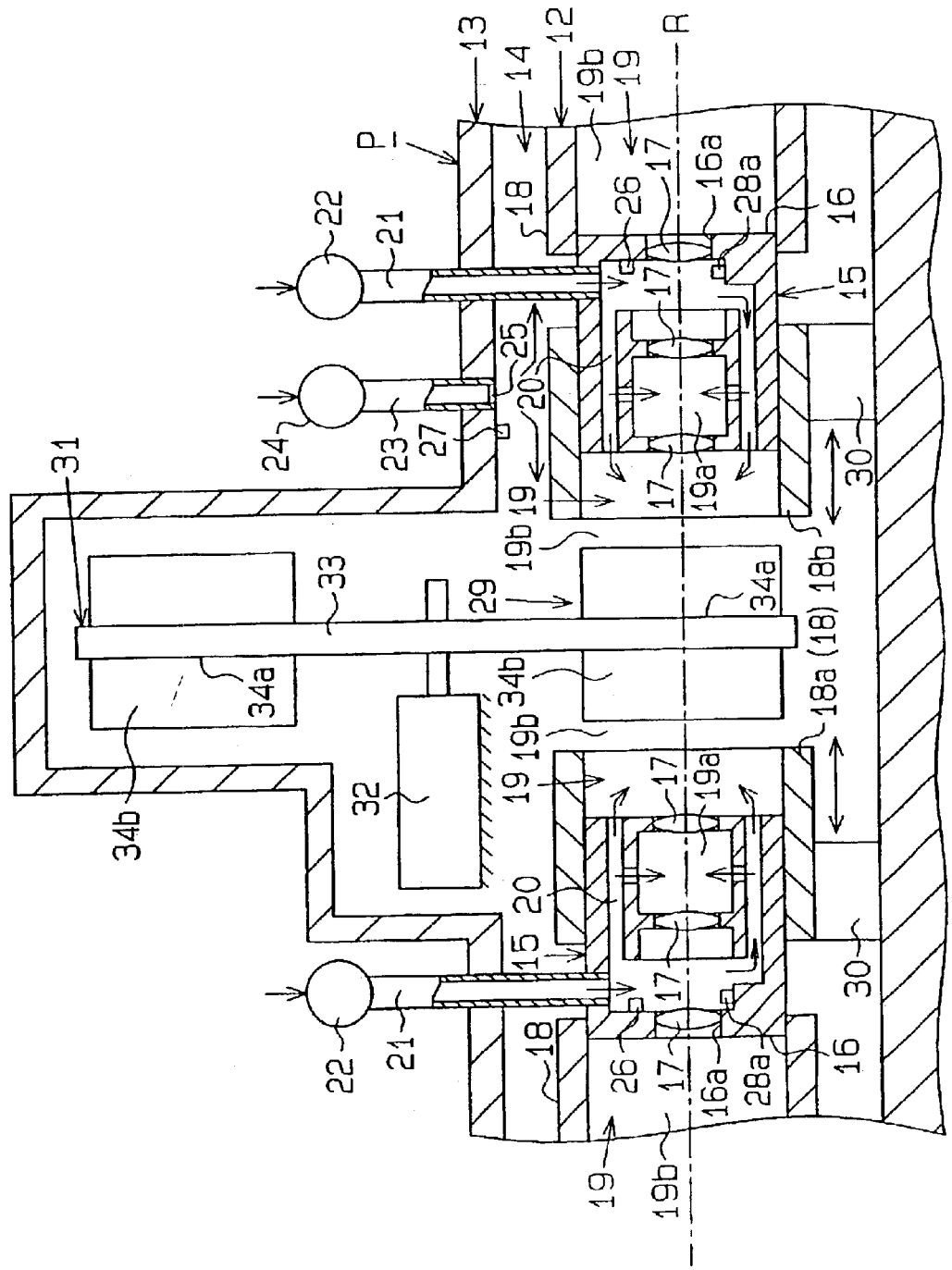
FIG. 5 is a schematic cross-sectional view showing the optical apparatus according to the third embodiment in a state in which switching of an optical member is permitted.

In the state shown in FIG. 4 in which switching has been completed, the drive apparatus 30 moves the movable shielding cylinders 18a, 18b toward each other and narrows the opened amount therebetween. The movable shielding cylinders 18a, 18b are fitted to the cylindrical member 34b in the second hermetic chamber 19 between adjacent lens systems 15. This disconnects the second hermetic chamber 19 from the first hermetic chamber 14 in the cover 13.

As shown in FIG. 1, a manipulation portion 35 is connected to the controller 7. The manipulation portion 35 sends a switch signal to the controller 7 for selecting one of the optical members 34a among the plural types of the optical members 34a. Based on the switch signal from the manipulation portion 35, the controller 7 controls the drive apparatus 30 and separates the movable shielding cylinders 18a, 18b from each other. In the separated state, as shown in FIG. 5, the movable shielding cylinders 18a, 18b are separated from the cylindrical member 34b of the optical member 34a between the lens systems 15. This opens the switch opening 29, connects the second hermetic chamber 19 to the first hermetic chamber 14, and permits the optical members 34a to be switched. The state in which switching is allowed is referred to as a first switch mode.

Then, in the first switch mode, the controller 7 controls the drive apparatus 32 based on the switch signal from the manipulation portion 35 and rotates the revolver 33. As the revolver 33 rotates, the revolver 33 is stopped when the optical member 34a corresponding to the switch signal is positioned in the second hermetic chamber 19 between the lens systems 15. The controller 7 then controls the drive apparatus 30 and moves the movable shielding cylinders 18a, 18b toward each other and returns to a switch completion state, which is shown in FIG. 4. This state is referred to as a second switch mode. Further, after completion of the switching, the controller 7 drives the gas supply portion 22 and provides optical path gas from the first gas supply passage 21 to the hermetic chamber 19.

In the third embodiment, a pressure sensor 26 and an oxygen concentration sensor 28a are arranged in each illumination lens barrel 16.

In addition to advantages (1) to (7) of the first embodiment, the third embodiment has the advantages discussed below.

The shifting of the movable shielding cylinders 18a, 18b facilitates the switching of the optical members 34a in the optical device 31, maintains the hermetic seal of the closed space about the optical path R, and improves the function for protecting the illumination optical system 3. Further, this advantage is obtained with the illumination optical system 3 of the exposure apparatus 1.

In the present embodiment, the deterioration of the inner cover 12 is checked based on changes in the oxygen concentration of the second hermetic chamber 19. However, the deterioration of the inner cover 12 may also be checked based on changes in the relationship between the pressure sensors 26 and the gas supply portions 22. That is, deterioration of the inner cover 12 decreases the gas pressure of the second hermetic chamber 19. Thus, the controller 7 increases the amount of gas supplied by the gas supply portion 22 so that the detection value of the gas pressure obtained by the pressure sensor 26 is constant. Accordingly, deterioration of the inner cover 12 may be detected based on changes in the amount of gas supplied from the gas supply portion 22.

Deterioration of the inner cover 12 may also be checked by monitoring the detection value of the gas pressure obtained by the pressure sensor 27, which is arranged in the first hermetic chamber 14. That is, when the inner cover 12 deteriorates, the gas in the second hermetic chamber 19 enters the first hermetic chamber 14 and increases the gas pressure of the first hermetic chamber 14. When the gas pressure of the first hermetic chamber 14 increases, the controller 7 decreases the amount of gas supplied by the gas supply portion 24 so that the detection value of the gas pressure obtained by the pressure sensor 27 is constant. Accordingly, deterioration of the inner cover 12 may be detected based on changes in the amount of gas supplied from the gas supply portion 24.

In this manner, the hermetic seal of the hermetic chamber 19 (whether or not there is deterioration) in the inner cover 12 is checked by monitoring the pressure values of the pressure sensors 26, 27 and the gas supply amount supplied from the gas supply portion 22, 24.

The entire structure of an exposure apparatus incorporating the optical systems of the first to third embodiments will now be discussed with reference to FIG. 6.

Figure 6:
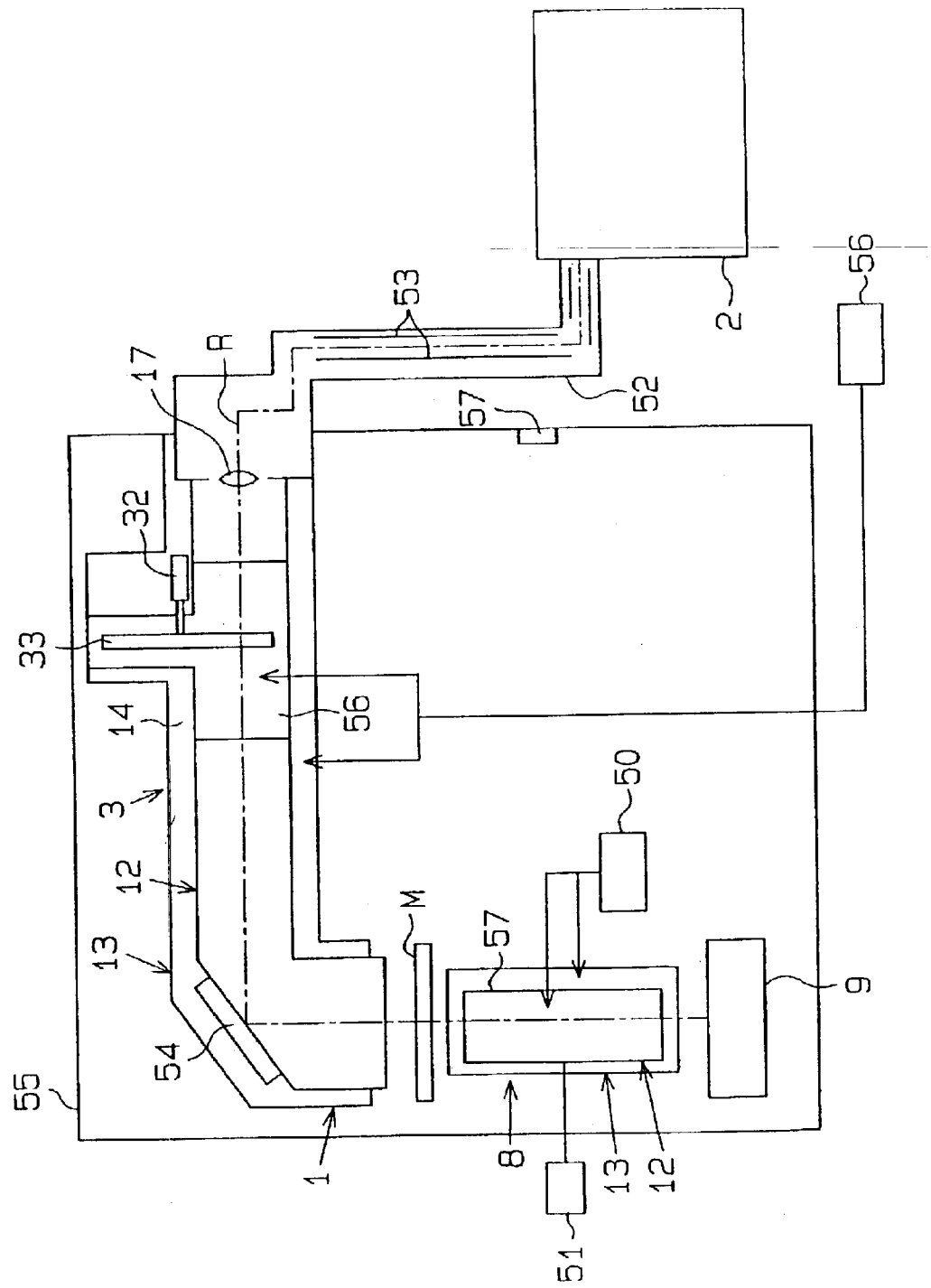
FIG. 6 is a schematic front cross-sectional view showing the entire structure of an exposure apparatus of the present invention.

The exposure apparatus shown in FIG. 6 has the same structure as the above described exposure apparatus 1. The apparatus includes a light source 2, an illumination optical system 3 for illuminating the mask M, a light transmitting system 52 for guiding the light emitted from the light source 2 to the lens 17, and a projection optical system 8 for projecting the pattern of a mask M to a photosensitive substrate W arranged on a photosensitive substrate stage 9. The light transmitting system 52 is also referred to as a BMU (Beam Matching Unit) and matches the optical axis of the illumination light emitted from the light source 2 with the optical axis of the illumination optical system 3. In the structure of the illumination optical system 3, the drawing shows only the lens 17, a revolver 33 having an optical member 34a, and a reflection mirror 54, and does not show other lenses.

In the exposure apparatus 1, the illumination optical system 3, the projection optical system 8, the mask M, the stage 9, and part of the BMU 52 are accommodated in a chamber 55. An oxygen concentration sensor 58 is arranged in the chamber 55 to detect the oxygen concentration in the chamber 55. The portion connecting the BMU 52 to the chamber 55 is sealed by a seal to prevent the entrance of air. The oxygen concentration sensor 58 detects whether or not the inert gas, such as nitrogen, provided to the illumination optical system 3 or the projection optical system 8 is leaking into the chamber 55. When the oxygen concentration in the chamber 55, which is based on the detection result of the oxygen concentration sensor 58, is lower than a regulating value, a warning is provided and the supply of inert gas to the first hermetic chamber 14 or the second hermetic chamber 19 is impeded to stop the emission of the exposure light from the light source 2. In this state, if a laser source is used as the light source 2, laser emission is stopped.

The illumination optical system 3 has an inner cover 12, which covers the space about the optical path R, and an outer cover 13, which covers the space about the inner cover 12. The outer cover 13 defines a first hermetic chamber 14, which is separated from the atmosphere of the chamber 55, and the inner cover 12 defines a second hermetic chamber 19, which is separated from the atmosphere in the outer cover 13. In the inner cover 12, since the structure of the section denoted by reference numeral 59 is similar to the third embodiment and the structures of the other sections are similar to those of the first or second embodiments, these sections will not be discussed in detail.

In the same manner as the illumination optical system 3, the projection optical system 8 also has an inner cover 12, which covers the space about the optical path R, and an outer cover 13, which covers the space about the inner cover 12. The outer cover 13 defines a first hermetic chamber 14, which is separated from the atmosphere in the chamber 55, and the inner cover 12 defines a second hermetic chamber 19, which is separated from the atmosphere in the outer cover 13. In the inner cover 12, since the structure of the section denoted by reference numeral 57 is similar to that of the first or second embodiments, this section will not be discussed in detail.

In the illumination optical system 3 having such a two-part structure, if a KrF excimer laser is used as a light source 2 of the exposure light, a gas supply controller 56 supplies the first hermetic chamber 14 and the second hermetic chamber 19 with clean air from which impurities are eliminated by a chemical filter. The first hermetic chamber 14 is purged with the clean air. Clean air is sealed in or flows through the second hermetic chamber 19. When an ArF excimer laser is used as the exposure light, the gas supply controller 56 supplies the first hermetic chamber 14 with clean air in the same manner and supplies the second hermetic chamber 19 with nitrogen gas. In this case, nitrogen gas is sealed in or flows through the second hermetic chamber 19.

Similarly, in the projection optical system 8, a gas supply controller 50 supplies the first hermetic chamber 14 and the second hermetic chamber 19 with clean air or nitrogen gas from which impurities are eliminated by a chemical filter. The gas supply controller 50 has the same structure as the gas supply controller 56 and supplies the first hermetic chamber 14 and the second hermetic chamber 19 in the projection optical system 8 with clean air or nitrogen gas in accordance with the wavelength of the laser. The gas supply controllers 50, 56 each have a clean air supply apparatus, which supplies the first hermetic chamber 14 or the second hermetic chamber 19 with clean air, and a nitrogen gas supply apparatus, which supplies the second hermetic chamber 19 with nitrogen gas.

The illumination optical system 3 includes the revolver 33 and the drive apparatus 32 for rotating the revolver 33, which are discussed in the description of the third embodiment. The revolver 33 is arranged in the second hermetic chamber 19, and the drive apparatus 32 is arranged in the first hermetic chamber 14. The drive apparatus 32 normally has a motor. Thus, the dust produced by the movement of the movable portion of the motor or the gas produced from the plastic covers of the motor wiring cords may contaminate the surface of the lenses due to photochemical reaction with the laser. To prevent such state, it is preferred that the drive apparatus 32 be accommodated in the first hermetic chamber 14.

The projection optical system 8 incorporates a control unit 51 for controlling the pressure of the gas between at least a pair of the lenses adjacent to each other in the optical axis direction among the lenses forming the projection optical system 8. The control unit 51 controls the pressure of the gas to decrease changes in the imaging characteristic of the projection optical system 8 caused by thermal changes resulting from absorption of exposure energy or changes in the atmospheric pressure and ambient temperature. In this structure, as described above, clean air or nitrogen gas may be used as the gas between the pair of lenses in accordance with the wavelength of the laser. It is preferred that the impurities included in such gas be eliminated by a chemical filter.

Like the illumination optical system 3 or the projection optical system 8, the interior of the BMU 52 may have a two-part structure. Further, instead of the two-part structure, a plurality of rectifying plates 53 extending parallel to the optical axis may be arranged in the BMU 52 so that the rectifying plates adjust the flow of gas, such as clean air or nitrogen gas.

In the present embodiment, an illumination light in the ultraviolet wavelength band, such as an ArF excimer laser beam (wavelength 193 nm), a KrF excimer laser beam (wavelength 248 nm), and an $F_2$ excimer laser source (wavelength 157 nm), and an EUVL (Extreme Ultraviolet Lithography) having a shorter wavelength, such as soft X-ray, may be used as the light source of the exposure apparatus 1. A clouded state of the optical elements may be detected in an exposure apparatus using i ray (wavelength 365 nm) and g ray (wavelength 436 nm) illumination lights as a light beam.

Further, in addition to nitrogen gas, the gas that is charged into the first hermetic chamber 14 or the second hermetic chamber 19 and is inert to light may be, for example, helium, neon, argon, krypton, xenon, and radon. It is preferred that chemically clean dry air (air purged from substances that cloud the lenses, such as ammonium ion, or the like, and float in a clean room or air having a humidity of 5% or less) be used. The gas charged into the first hermetic chamber 14 and the gas charged into the second hermetic chamber 19 may be produced by combining various types of gases.

The present invention may also be applied to a scanning type exposure apparatus, which synchronously moves a mask and a substrate to expose the pattern of the mask (U.S. Pat. No. 5,473,410), and a step and repeat type exposure apparatus, which exposes the pattern of the mask with the mask and the substrate in a static state and sequentially moves the substrate. The type of exposure apparatus is not limited to exposure apparatuses for fabricating semiconductors and may be applied widely to, for example, a liquid crystal exposure apparatus for exposing a liquid crystal display element pattern on a polygonal glass plate and an exposure apparatus for fabricating thin film magnetic heads.

The optical apparatus according to the present invention may be applied to only one of the multiple optical elements that form the projection optical system or the illumination optical system.

In the projection optical system, all of the optical elements are not limited to dioptric lenses. The projection optical system may be an optical system formed by reflection elements (mirrors) or may be a catadioptric system formed by dioptric lenses and reflection elements. Accordingly, the optical apparatus of the present invention may be applied to a reflection element. Further, the projection optical system is not limited to a reducing magnification system and may be an equal magnification system or an enlarging magnification system.

In the projection optical system, when far infrared rays such as when an excimer laser is used, a glass material such as quartz or fluorite may be used to transmit the far infrared rays.

As described above, the exposure apparatus of the present embodiment may be manufactured by assembling each type of sub-system, including each element of the claims of the present application, so as to maintain a predetermined mechanical accuracy, electrical accuracy, and optical accuracy. To guarantee each type of accuracy, each optical system is adjusted to achieve the optical accuracy, each mechanical system is adjusted to achieve the mechanical accuracy, and each electrical system is adjusted to achieve the electric accuracy before and after assembly. The process during which the sub-systems are assembled to build the exposure apparatus includes mechanical connection between the sub-systems, wire connections of electric circuits, and pipe connections of pressure circuits. Of course, each sub-system is assembled before the entire exposure apparatus is assembled. After the exposure apparatus is assembled from the sub-systems, entire adjustment is performed so that various types of accuracies are guaranteed in the entire exposure apparatus. It is preferred that the manufacture of the exposure apparatus be performed in a clean room, in which temperature and cleanness are controlled.

A semiconductor device is fabricated by undergoing the steps of designing the function and capability of the device, producing a reticle based on the designing step, producing a wafer from a silicon material, exposing a pattern of the reticle on the wafer with the exposure apparatus, assembling the device (dicing, bonding, and packaging), and inspecting the device. Accordingly, the present invention is not restricted to the above embodiments and may also be applied to a structure in which the embodiments are combined as required.

The optical apparatus P of each of the above embodiments has a two-part structure formed by the inner cover 12, which covers the space about the optical path R, and the outer cover 13, which covers the inner cover 12. Instead of this structure, further covers may cover the outer cover 13 to form a structure having three parts or more.

The illumination optical system 3 may be provided with two types of oxygen concentration sensors. In this case, one of the sensors is arranged in the first hermetic chamber 14 of the illumination optical system 3, while the other sensor is arranged outside the illumination optical system 3. By arranging the sensors in this manner, one of the sensors detects the oxygen concentration of the first hermetic chamber 14, while the other sensor detects whether or not inert gas is leaking from the first hermetic chamber 14. With regard to the projection optical system 8, in the same manner, one of the sensors may be arranged in the first hermetic chamber 14 of the projection optical system 8, while the other sensor is arranged outside the projection optical system 8. This obtains the same results.

With regard to the BMU 52, in the same manner, one of the sensors may be arranged in the BMU 52, while the other is arranged outside the BMU 52. This obtains the same results.

When the output of the sensor arranged outside the illumination optical system 3, the projection optical system 8, or the BMU 52 becomes lower than a regulating value, a warning may be given to inform the operator of such condition. In such case, the supply of inert gas, such as nitrogen, to the first hermetic chamber 14 or the second hermetic chamber 19 may be impeded.

It should be apparent to those skilled in the art that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope and equivalence of the appended claims.

What is claimed is:

1. An optical apparatus comprising:
    a two-part cover structure including an inner cover and an outer cover, wherein the inner cover covers a space about an optical path of an irradiation light, the outer cover encloses the inner cover and separates the optical path from ambient air;
    a first chamber which is defined between the inner cover and the outer cover and which is charged with a predetermined gas;
    a second chamber which is defined in the inner cover and which separates the optical path from the gas in the first chamber; and
    a controller connected to the inner cover to control the pressure in the second chamber so that the flow of the predetermined gas from the first chamber to the second chamber is prevented.

2. The optical apparatus according to claim 1, wherein the second chamber includes a section located between two of the optical members.

3. The optical apparatus according to claim 1, wherein the gas in the first chamber is more pure than the ambient air, and the second chamber is charged with an inert gas.

4. The optical apparatus according to claim 3, further comprising a sensor communicated with the inner cover to measure the concentration of the gas in the second chamber.

5. The optical apparatus according to claim 1, wherein the gas in the first chamber is a first inert gas, and the second chamber is charged with a second inert gas.

6. The optical apparatus according to claim 1, further comprising:
    a switch opening provided with the inner cover;
    an actuating mechanism connected to the switch opening to increase and decrease an opening amount of the switch opening;
    wherein the at least one optical member is movable between the first chamber and the second chamber by way of the switch opening; and
    the controller connected to the actuating mechanism to set a first switch mode in which movement of the optical member between the first chamber and the second chamber is permitted by increasing the opening amount of the switch opening with the actuating mechanism, and a second switch mode in which movement of the optical member between the first chamber and the second chamber is prohibited by decreasing the opened amount of the switch opening with the actuating mechanism.

7. The optical apparatus according to claim 6, further comprising:
    a revolver that supports the optical member and is rotatable about an axis; and
    a drive apparatus connected to the revolver to rotate the revolver, wherein the controller controls the drive apparatus to rotate the revolver, and rotation of the revolver moves the optical member between the first chamber and the second chamber.

8. The optical apparatus according to claim 1, wherein the controller controls the pressure in the second chamber so that the pressure in the second chamber is higher than the pressure in the first chamber.

9. An exposure apparatus, comprising:
    an optical system disposed on a light path of an exposure light, the optical system irradiating a mask with the exposure light and transferring a pattern on the mask onto a substrate, wherein the optical system includes,
    a two-part cover structure including an inner cover and an outer cover, wherein the inner cover covers a space about an optical path of the exposure light, the outer cover encloses the inner cover and separates the optical path from ambient air,
    a first chamber which is defined between the inner cover and the outer cover and which is charged with a predetermined gas;
    a second chamber which is defined in the inner cover and which separates the optical path from the gas in the first chamber; and
    a controller connected to the inner cover to control the pressure in the second chamber so that the flow of the predetermined gas from the first chamber to the second chamber is prevented.

10. The exposure apparatus according to claim 9, wherein the optical system includes:
   a plurality of first optical element groups arranged along the optical path to irradiate the mask with the exposure light;
   a plurality of second optical element groups arranged along the optical path to guide the exposure light that has passed through the mask pattern to the substrate; and
   wherein the second chamber includes at least one of an illumination barrel that retains the first optical element groups and a projection barrel that retains the first optical element groups.

11. An exposure apparatus for illuminating a pattern formed on a mask with an exposure light from a light source to project an image of the pattern on a substrate, the exposure apparatus comprising:
   a two-part cover structure including an inner cover and an outer cover, wherein the inner cover covers a space about an optical path of the exposure light, the outer cover encloses the inner cover and separates the optical path from ambient air:
   a first chamber which is defined in the inner cover, encompasses at least part of the optical path, and is charged with a first gas;
   a second chamber which is defined between the inner cover and the outer cover, encompasses the inner cover, and is charged with a second gas; and
   a controller connected to the inner cover to control the pressure in the first chamber so that the flow of the second gas to the first chamber is prevented.

12. The exposure apparatus according to claim 11, wherein the first gas is an inert gas and the second gas is more pure than ambient air.

13. The exposure apparatus according to claim 12, wherein the second gas is an inert gas.

14. The exposure apparatus according to claim 11, wherein the controller controls the pressure in the first chamber so that the pressure in the first chamber is higher than the pressure in the second chamber.

15. The exposure apparatus according to claim 11, wherein the pressure in the second chamber is higher than the ambient air pressure.

16. The exposure apparatus according to claim 11, wherein the first chamber is arranged between the light source and the mask.

17. The exposure apparatus according to claim 11, wherein an illumination optical system is disposed between the light source and the mask to illuminate the mask with the exposure light, and the first chamber forms at least part of the illumination optical system.

18. The exposure apparatus according to claim 11, wherein the first chamber is located between the mask and the substrate.

19. The exposure apparatus according to claim 11, wherein a projection optical system is disposed between the mask and the substrate to project the image of the pattern onto the substrate, and the first chamber forms at least part of the projection optical system.

20. The exposure apparatus according to claim 11, further comprising:
   a first gas supply system connected to the inner cover to supply the first chamber with the first gas; and
   a second gas supply system connected to the outer cover to supply the second chamber with the second gas;
   wherein the controller controls the at least one of the first gas supply system and the second gas supply system so that the flow of the second gas from the second chamber to the first chamber is prevented.

21. The exposure apparatus according to claim 11, further comprising:
   at least one optical member disposed in the first chamber; and
   a drive apparatus which is disposed in the second chamber, and communicated with the optical member to move the optical member.

22. The optical apparatus according to claim 1, further comprising:
   at least one optical member disposed in the second chamber; and
   a drive device which is disposed in the first chamber and which is in communication with the optical member in the second chamber.

23. The optical apparatus according to claim 11, further comprising:
   at least one optical member disposed in the first chamber; and
   a drive device which is disposed in the second chamber and which is in communication with the optical member in the first chamber.

* * * * *